United States Patent [19]
Willems

[11] Patent Number: 5,789,977
[45] Date of Patent: Aug. 4, 1998

[54] AUDIO AMPLIFIER

[75] Inventor: Stefan M. J. Willems, Leuven, Belgium

[73] Assignee: U.S. Philips Corporation, New York, N.Y.

[21] Appl. No.: 767,732

[22] Filed: Dec. 16, 1996

[30] Foreign Application Priority Data

Dec. 22, 1995 [EP] European Pat. Off. ............ 95203605

[51] Int. Cl.[6] .............................. H03F 3/68; H03F 3/191
[52] U.S. Cl. .......................... 330/126; 330/306; 381/120
[58] Field of Search ...................... 330/126, 303, 330/304, 305, 306, 141, 281, 302; 381/98, 101, 103, 120

[56] References Cited

U.S. PATENT DOCUMENTS

| | | | |
|---|---|---|---|
| 3,605,042 | 9/1971 | Rapp | 330/305 X |
| 3,750,044 | 7/1973 | Stanley | 330/126 |
| 4,539,526 | 9/1985 | Davis | 330/126 X |
| 4,797,933 | 1/1989 | Hahne | 330/126 X |
| 5,138,665 | 8/1992 | Ito | 381/101 X |
| 5,481,617 | 1/1996 | Bjerre | 381/98 X |

Primary Examiner—Steven Mottola
Attorney, Agent, or Firm—Steven R. Biren

[57] ABSTRACT

An audio amplifier (20) which includes an arrangement (300) for influencing an audio signal applied to the audio amplifier (20). This arrangement (300) has an amplifier for additionally amplifying a high-frequency range of the audio signal relative to the rest of the audio signal. This additional amplification takes place once a value of the audio signal has exceeded a limit value. The additional amplification only takes place for a brief period of time. The audio amplifier additionally amplifies high-frequency peaks in the audio signal for a brief period of time. The rising and falling slopes of these peaks are briefly enlarged as a result. Especially for pop music, this appears to be an attractive effect.

7 Claims, 3 Drawing Sheets

AUDIO AMPLIFIER

BACKGROUND OF THE INVENTION

1. Field of the Invention

The invention relates to an audio amplifier comprising an arrangement for influencing an audio signal. Such an audio amplifier is used in sound reproduction systems such as audio installations and televisions.

2. Description of the Related Art

The arrangement for influencing the audio signal comprises a preamplifier, for example, formed by an integrated circuit of the TEA6330T type manufactured by Philips Semiconductors. This known preamplifier has an settable transfer characteristic. A user of the audio amplifier can control the volume, the bass and treble control ranges at his own discretion by adapting this transfer characteristic. In this known audio amplifier, settings made by the user are not adapted in response to the audio signal applied to the input of the audio amplifier.

SUMMARY OF THE INVENTION

It is an object of the invention to provide an audio amplifier by which the audio signal is influenced in such a way that a novel psycho-acoustic effect is obtained.

For this purpose, an audio amplifier, as defined in the opening paragraph, is characterized in that the arrangement comprises amplifier means for additionally amplifying a high-frequency range of the audio signal relative to a remaining range of the audio signal for at most, a certain period of time when a value of the audio signal exceeds a limit value. These measures cause high-frequency peaks occurring in the audio signal to be additionally amplified for a brief period of time. This leads to the rising and falling slopes of these peaks being briefly enlarged. As a result, the user experiences the psycho-acoustic effect that the audio signal has a large impact. Especially for pop music, this appears to be an attractive effect.

Audio amplifiers which have so-termed dynamic expanders are known per se. These dynamic expanders additionally amplify the audio signal when it has a large value. However, they additionally amplify the entire frequency spectrum of the audio signal by continuously doing so, thus not for a brief period of time.

An embodiment of the audio amplifier according to the invention is characterized in that the high-frequency range comprises components of the audio signal which have a frequency of 2 kHz and over.

A further embodiment of the audio amplifier according to the invention is characterized in that the amplifier means is arranged for additionally amplifying the high-frequency range by 6 dB relative to the remaining range.

A further embodiment of the audio amplifier according to the invention is characterized in that the time during which the amplifier means additionally amplifies the high-frequency range is equal to 5 ms.

The intended psycho-acoustic effect is optimized by these embodiments.

The invention further relates to a sound reproduction system, an arrangement for influencing an audio signal and a method of influencing an audio signal.

These and other aspects of the invention will be apparent from and elucidated with reference to the embodiments described hereinafter.

BRIEF DESCRIPTION OF THE DRAWINGS

In the drawings.

Like elements in the drawing Figures are designated by like references.

DESCRIPTION OF THE PREFERRED EMBODIMENTS

Figure 1:
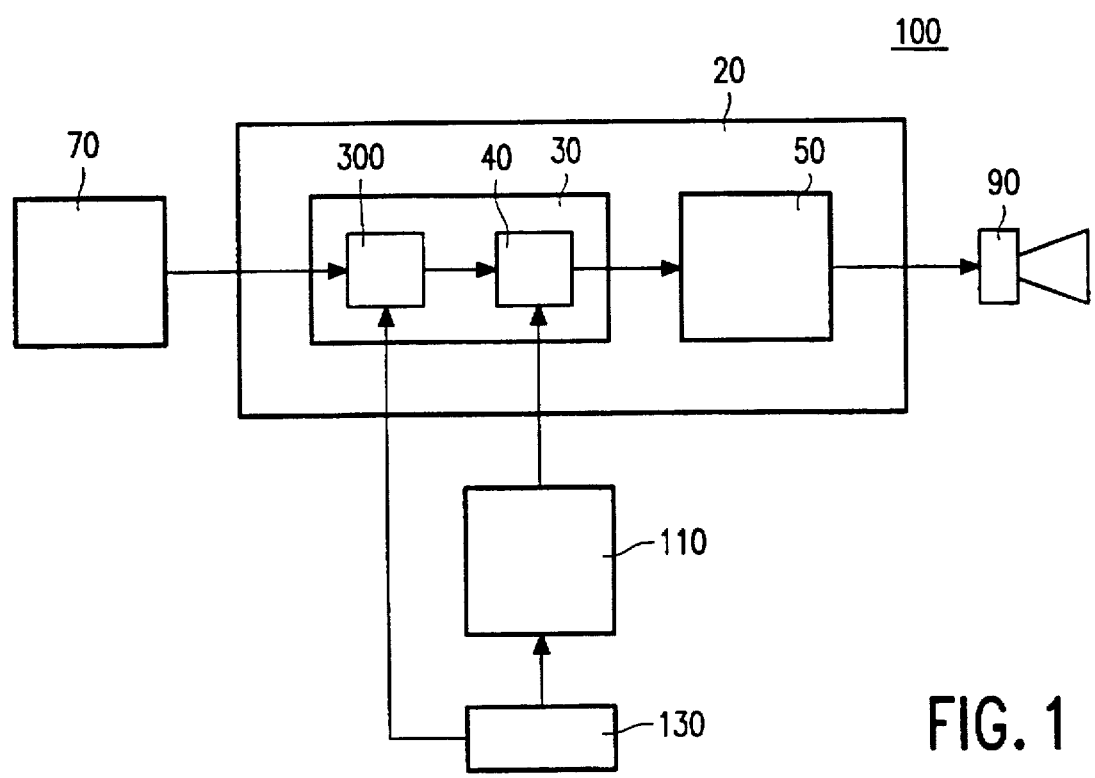
FIG. 1 shows a sound reproduction system comprising an audio amplifier.

FIG. 1 shows a sound reproduction system 100. The sound reproduction system 100 is, for example, an audio installation for in the house or in the car, a portable audio installation or a television. The sound reproduction system comprises an audio amplifier 20, at least one audio source 70 which applies an audio signal to the audio amplifier 20, and one or more loudspeakers 90 for the acoustic reproduction of the audio signal amplified by the audio amplifier. The audio source 70 is, for example, a receiver for a radio or television signal, a cassette player, a Compact Disc player (CD) or a Digital Compact Cassette player (DCC). The audio amplifier 20 comprises an arrangement 30 for influencing the audio signal, which includes a circuit 300 for briefly additionally amplifying a high-frequency range of the audio signal when the instantaneous value of the audio signal exceeds a certain limit value, and a preamplifier stage 40. The audio amplifier 20 further includes an output amplifier stage 50. The output amplifier stage 50 has a fixed gain factor. The output amplifier stage 50 may comprise, for example, an integrated circuit of the TDA1555Q type, manufactured by Philips Semiconductors. The preamplifier stage 40 may comprise an integrated circuit of the TEA6330T type, manufactured by Philips Semiconductors. This integrated circuit has a transfer characteristic which may be set by adapting three parameters. These parameters are the volume control, by which the gain factor for the entire frequency range can be adapted in steps of a certain number of dBs, the bass control, by which the gain factor for the low tones in the frequency spectrum can be amplified or attenuated in a relative manner in steps of a certain number of dBs, and a treble control, by which the gain factor for the high tones in the frequency spectrum can be amplified or attenuated in a relative manner in steps of a certain number of dBs. The sound reproduction system further includes a control circuit 110, for example, of a program controlled type, which is coupled to the preamplifier stage 40, for example, by a so-called I$^2$C bus for setting the volume, bass and treble controls in accordance with operating instructions which may be entered by a user via a control panel 130. The settings of circuit 300 may also be adjusted by the control panel 130.

Figure 2:
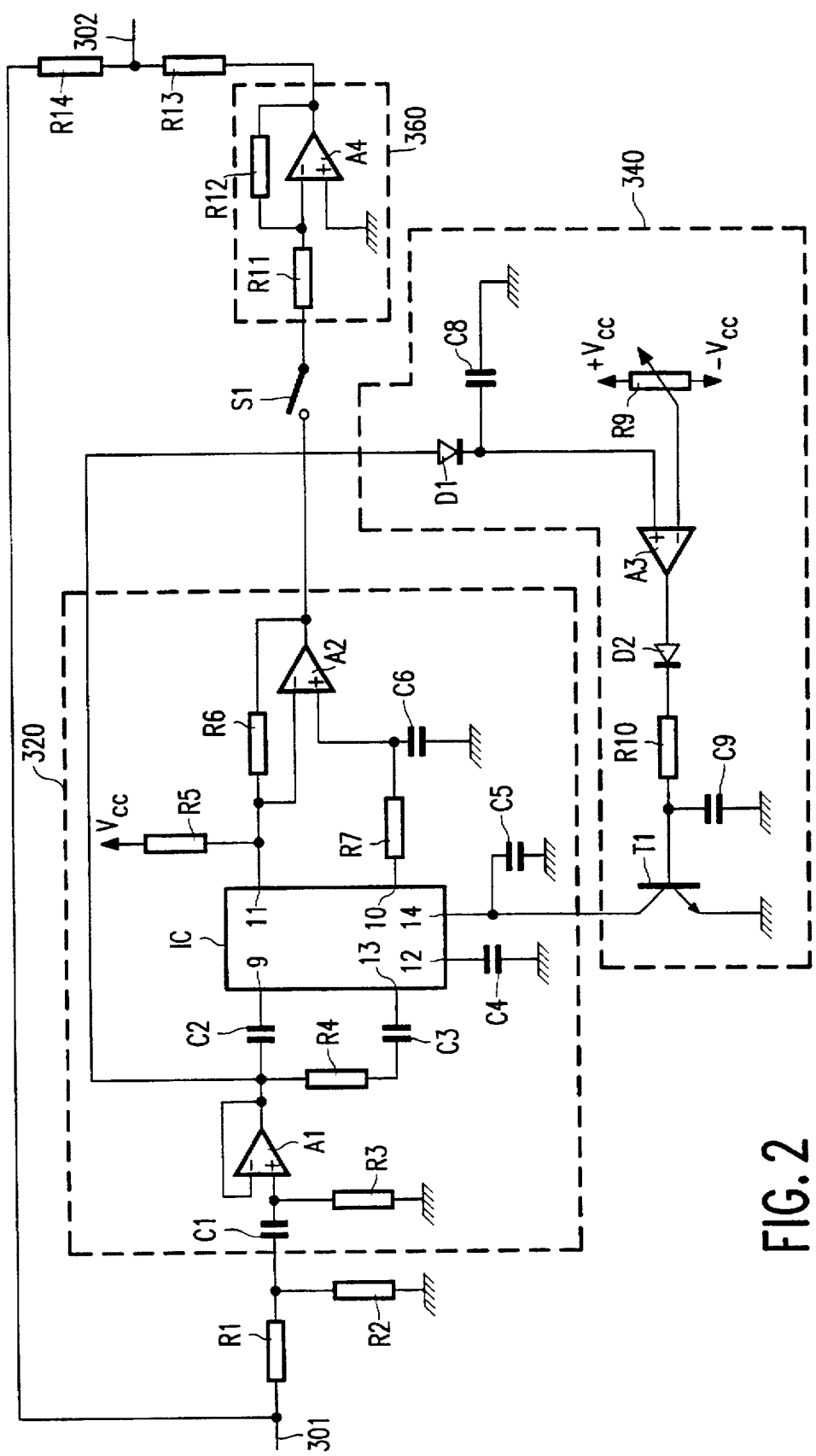
FIG. 2 gives a detailed representation of a first embodiment of a circuit for influencing an audio signal which circuit is included in the audio amplifier.

FIG. 2 shows a first embodiment of the circuit 300 for additionally amplifying a high-frequency range of the audio signal for a brief period of time when the instantaneous value of the audio signal exceeds a specific limit value. The circuit is shown for only one audio channel. The circuit has a signal input 301 for receiving the audio signal coming from the audio source 70. This signal input is connected to a first terminal of a resistor R1. The other terminal of the resistor R1 is connected to a first terminal of a resistor R2 whose other terminal is connected to ground. Furthermore, the resistor R1 is connected to a first terminal of a capacitor C1. A second terminal of the capacitor C1 is connected, on the one hand, to a resistor R3 which is further connected to ground and, on the other hand, to an input of a buffer amplifier A1. An output of the buffer amplifier A1 is connected to a first terminal of a capacitor C2 whose second terminal is connected to a pin of an integrated circuit IC. This integrated circuit is the NE572, manufactured by Philips semiconductors. The relevant pins 9, 10, 11, 12, 13, 14 of the integrated circuit IC are shown in the drawing Figure. The capacitor C2 is connected to pin 9 of the integrated circuit IC. The output of the buffer amplifier A1 is further connected to a first terminal of a resistor R4. A second terminal of resistor R4 is connected to a first terminal of a capacitor C3. A second terminal of the capacitor C3 is connected to pin 13 of the integrated circuit IC. A fourth capacitor C4 is inserted between pin 12 of the integrated circuit IC and ground. A fifth capacitor C5 is inserted between pin 14 of the integrated circuit IC and ground. The circuit 300 further includes a resistor R5 of which a first terminal is connected to pin 11 of the integrated circuit IC and a second terminal is connected to the positive supply voltage Vcc. The first terminal of the resistor R5 is further connected to a negative input of an amplifier A2 and to a first terminal of a resistor R6. A second terminal of resistor R6 is connected to an output of the amplifier A2. A first terminal of a resistor R7 is connected to pin 10 of the integrated circuit IC. A second terminal of resistor R7 is connected to a positive input of the amplifier A2 and to a first terminal of a capacitor C6. A second terminal of the capacitor C6 is connected to ground.

The output of the amplifier A1 is connected to an anode of a diode D1. The cathode of the diode is connected to a first terminal of a capacitor C8. A second terminal of the capacitor C8 is connected to ground. The cathode of the first diode D1 is further connected to a positive input of a comparator A3. A negative input of the comparator is connected to a variable resistor R9 which is inserted between the positive supply voltage Vcc and negative supply voltage -Vcc. An output of the comparator A3 is connected to an anode of a diode D2. The cathode of this diode is connected to a first terminal of a resistor R10. A second terminal of the resistor R10 is connected to a first terminal of a capacitor C9. A second terminal of the capacitor C9 is connected to ground. Furthermore, the second terminal of the resistor R10 is connected to a base of a transistor T1. An emitter of the transistor is connected to ground, a collector is connected to pin 14 of the integrated circuit IC.

The output of the amplifier A2 is further connected to a first terminal of a switch S1. A second terminal of the switch S1 is connected to a first terminal of a resistor R11. A second terminal of the resistor R11 is connected to a negative input of an amplifier A4. A positive input of the amplifier A4 is connected to ground. The negative input of the amplifier 4 is further connected to a first terminal of a resistor R12. A second terminal of the resistor R12 is connected to an output of the amplifier A4. The output of the amplifier A4 is further connected to a first terminal of a resistor R13. A second terminal of the resistor R13 is connected to a signal output 302. Through this output the signal influenced by the circuit 300 is applied to the preamplifier stage 40. The signal output is further connected to a first terminal of a resistor R14. A second terminal of the resistor R14 is connected to the signal input 301.

Figure 4:
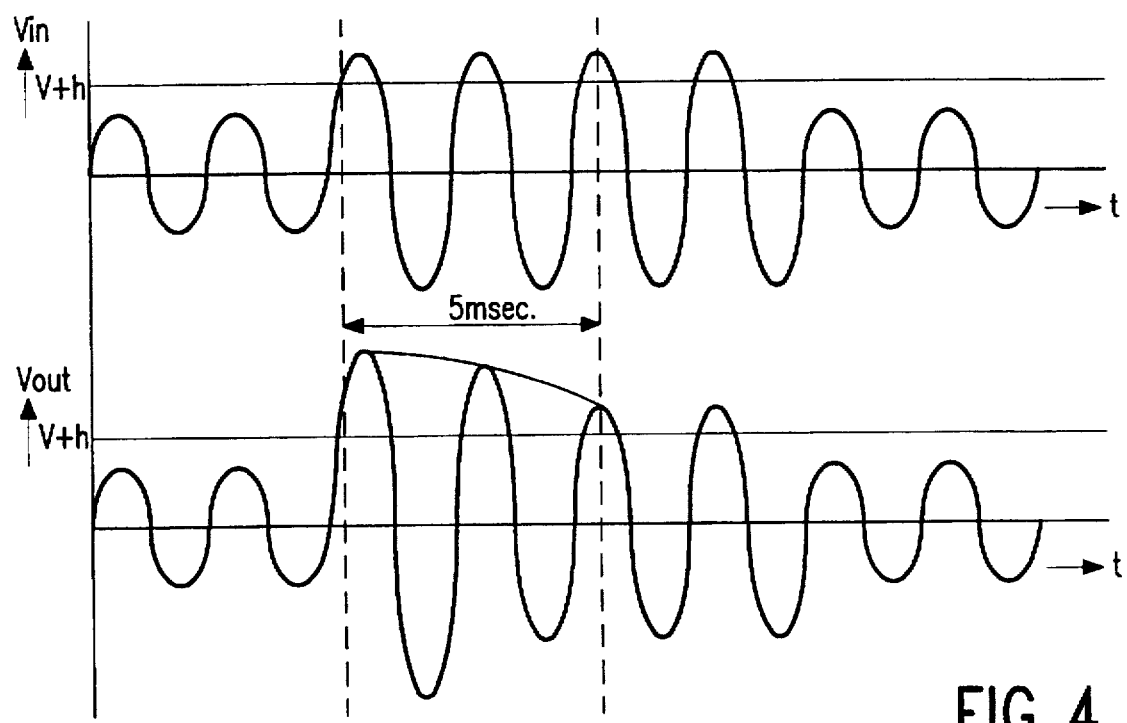
FIG. 4 shows the shape of an audio signal influenced by such a circuit, plotted against time.

The integrated circuit IC, the capacitors C1 to C6, the resistors R3 to R7 and the amplifiers A1 and A2 together form a dynamic range expander 320. The dynamic range expander is connected as is shown in FIG. 4 on page 152 of the data handbook IC01a "Semiconductors for Radio and Audio Systems, BB112 to TDA1554Q", Philips Semiconductors 1992. The dynamic range expander 320 is a circuit which additionally amplifies the audio signal when it has a large amplitude and amplifies the audio signal to a lesser extent when it has a small amplitude. The values of C1 and R3 are chosen so that they together form a high-pass filter having a cut-off frequency of about 2 kHz. The values of C4 and C5 are 15 nF and 150 nF, respectively. This provides that the attack time and release time of the dynamic range expander 320 are 0.15 ms and 1.5 ms, respectively. The value of R6 is 35 kOhms. This provides that peaks in the signal are amplified by about 6 dB by the dynamic range expander. The rest of the values of components of the dynamic range expander 320 are as shown in FIG. 4 on page 152 of said data handbook.

The capacitors C8 and C9, the resistors R9 and R10, the diodes D1 and D2, the transistor T1 and the comparator A3 together form a detection circuit 340. Diode D1, together with capacitor C8, forms a rectifier. Resistor R9 is intended to apply a settable voltage to the negative input of the comparator A3. Diode D2 is a rectifier. Capacitor C9 is a charging capacitor whose charging time is also determined by resistor R10. Transistor T1 is included to short-circuit pin 14 of the integrated circuit IC to ground.

Resistors R11 and R12 and the amplifier A4 together form an inverter circuit 360 intended to compensate for the amplifier A2 arranged as an inverter. Resistors R13 and R14 mutually have the same value and coupling resistors are necessary for mixing the signals coming from the signal input 301 and those from the inverter 360. Resistors R1 and R2 are intended for adapting the signal level to the input sensitivity of the NE572.

The operation of the circuit 300 is as follows. If the user does not wish the high-frequency peaks of the audio signal to be additionally amplified for a brief period of time, he opens switch S1 (position shown). The audio signal on the signal input 301 is then applied unamplified to the signal output 302. If the user closes switch S1, the high-frequency signal additionally amplified by the dynamic range expander 320 is added by the inverter 360 to the signal coming straight from the signal input 301 and applied to the signal output 302.

The high-pass filter C1, R3 provides that only frequency components of 2 kHz and more are applied to the dynamic range expander 320. If the value of these frequency components is large, they are additionally amplified by the integrated circuit IC. These additionally amplified frequency components are applied to the detector circuit 340. If the value of these additionally amplified components exceeds a voltage that can be set by means of the variable resistor R9, the comparator A3 will produce a positive voltage. As a result, the capacitor C9 is charged with a certain time constant. This means that, after a certain period of time, the voltage on the base of the transistor T1 has become so large that this transistor will start conducting. Consequently, the pin 14 of the integrated circuit IC is short-circuited to ground. This results in the integrated circuit IC no longer additionally amplifying the high-frequency components. The values of C9 and R10 are preferably selected such that about 5 ms after the value of the additionally amplified audio signal has exceeded the adjustable voltage, the transistor T1 starts conducting well.

The dynamic range expander 320 is set not to amplify small-value high-frequency signals additionally.

Figure 3:
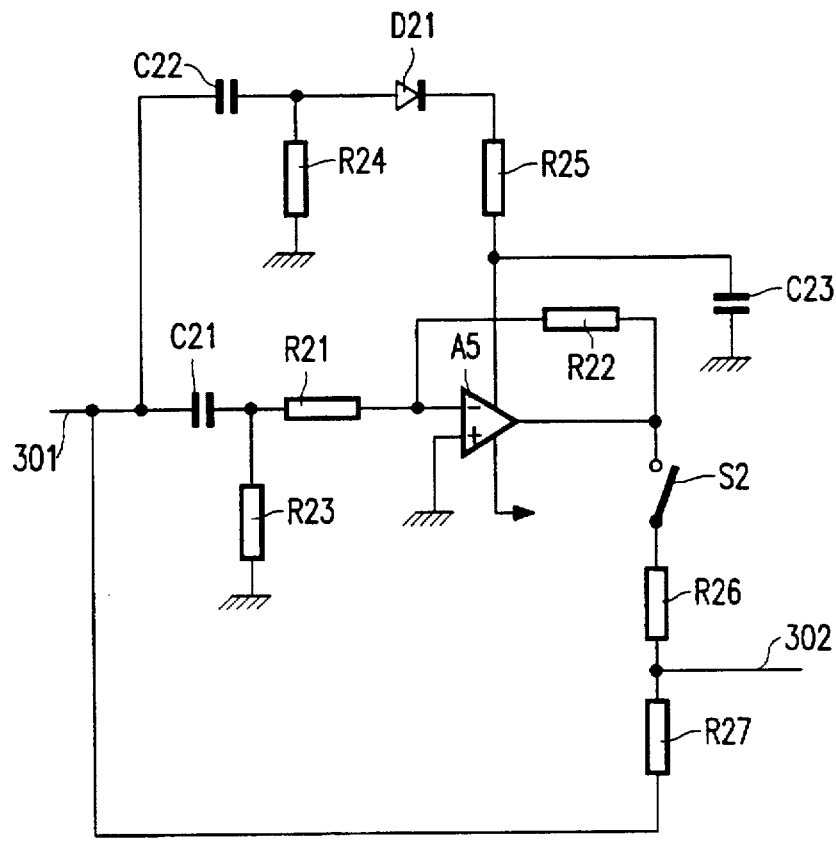
FIG. 3 gives a detailed representation of a second embodiment of a circuit for influencing an audio signal which circuit is included in the audio amplifier.

FIG. 3 gives a detailed representation of a second embodiment of a circuit 300 included in the audio amplifier and intended to influence an audio signal. Here too the circuit is shown for only one audio channel. The circuit comprises a capacitor C21 which is connected by a first terminal to the signal input 301. By a second terminal the capacitor is connected to a first terminal of a resistor R23. Another terminal of resistor R23 is connected to ground. Furthermore, the second terminal of the capacitor C21 is connected to a first terminal of a resistor R21. A second terminal of the resistor R21 is connected to a negative input of a transconductance amplifier A5. A positive input of the transconductance amplifier is connected to ground. The negative input is furthermore connected to a first terminal of a resistor R22 of which a second terminal is connected to an output of the transconductance amplifier. The signal input 301 is further connected to a first terminal of a capacitor C22. A second terminal of the capacitor C22 is connected to a first terminal of a resistor R24. A second terminal of the resistor R24 is connected to ground. The second terminal of the capacitor C22 is also connected to an anode of a diode D21. A cathode of the diode D21 is connected to a first terminal of a resistor R25. The second terminal of resistor R25 is connected to a first terminal of the capacitor C23. A second terminal of the capacitor C23 is connected to ground. The second terminal of resistor R25 is further connected to a power supply input of the transconductance amplifier A5. The output of the transconductance amplifier A5 is coupled to a first terminal of a switch S2. A second terminal of the switch S2 is connected to a first terminal of a resistor R26. A second terminal of the resistor R25 is connected to a signal output 302. The signal output 302 is further connected to a first terminal of a resistor R27. A second terminal of the resistor R27 is connected to the signal input 301.

The resistor R23 and the capacitor C21 together form a high-pass filter having a cut-off frequency of about 2 kHz, as do the capacitor C22 and the resistor R24. The resistors R21 and R22 are included for setting the transconductance amplifier A5. Resistors R26 and R27 mutually have the same value and coupling resistors are necessary for mixing the signals coming from the signal input 301 and from the transconductance amplifier A5. Diode D21, resistor R25 and capacitor C23 together provide that the transconductance amplifier is set for additionally amplifying high-frequency peaks for a brief period of time.

The operation of the circuit is as follows. If the user does not wish high-frequency peaks of the audio signal to be additionally amplified for a brief period of time, he opens switch S2 (position shown). In that case, the audio signal on the signal input 301 is applied to signal output 302 as an unamplified signal. If the user closes switch S2, the high-frequency signal additionally amplified by the transconductance amplifier is added to the signal coming straight from the signal input 301 and is applied to signal output 302. The high-pass filter formed by capacitor C21 and resistor R23 allows only high-frequency components of the audio signal to be applied to the transconductance amplifier A5. If high-frequency signal components having a large value are available on the signal input, a rectified signal having a large amplitude is produced by the diode D21. A relatively large current will then start flowing through the resistor R25. As a result, the gain factor of the transconductance amplifier rises. The result is that the high-frequency signal will be additionally amplified by the transconductance amplifier. The charging of the capacitor C23 causes the voltage drop across resistor R25 to diminish after a period of time. Consequently, the gain factor of the transconductance amplifier will drop and the high-frequency component of the signal will no longer be additionally amplified. High-frequency signals having a small amplitude are not amplified additionally by the transconductance amplifier A5. The values R25 and C23 are selected such that after about 5 ms, the high-frequency components will no longer be amplified additionally.

Needless to observe that the values of a number of components in the embodiment shown in FIG. 2 as well as the embodiment shown in FIG. 3 can be set by the user, so that the user himself can set the time of the high-frequency peaks, the gain factor by which the high-frequency peaks are additionally amplified as well as the frequency of the signals which are amplified additionally at one's own discretion.

FIG. 4 shows the curve of a sine-shaped signal influenced by the circuit 300 plotted against time. The upper half of the Figure shows the curve of a sine-shaped signal having a frequency of about 4 kHz plotted against time. During the first two cycles, the sine-shaped signal remains below the limit value Vth, after which the sine-shaped signal exceeds the limit value for four cycles, while the sine-shaped signal again remains below the limit value Vth during the last two cycles shown.

In the lower half of the Figure, the audio signal processed by circuit 300 is plotted against time. There may be observed that the moment the signal exceeds the limit value Vth, the peaks of the signal are amplified additionally. After 5 ms, the peaks are no longer amplified additionally.

I claim:

1. Audio amplifier comprising an arrangement for influencing an audio signal, characterized in that the arrangement comprises amplifier means for additionally amplifying a high-frequency range of the audio signal relative to a remaining range of the audio signal for, at most, a certain period of time when a value of the audio signal exceeds a limit value.

2. Audio amplifier as claimed in claim 1, characterized in that the high-frequency range comprises components of the audio signal having a frequency of 2 kHz and over.

3. Audio amplifier as claimed in claim 1, characterized in that the amplifier means is arranged for additionally amplifying the high-frequency range by 6 dB relative to the remaining range.

4. Audio amplifier as claimed in claim 1, characterized in that the certain period of time during which the amplifier means additionally amplifies the high-frequency range is substantially equal to 5 ms.

5. Sound reproduction system comprising an audio amplifier comprising an arrangement for influencing an audio signal, characterized in that the arrangement comprises amplifier means for additionally amplifying a high-frequency range of the audio signal relative to a remaining range of the audio signal for, at most, a certain period of time when a value of the audio signal exceeds a limit value.

6. Arrangement for influencing an audio signal, characterized in that the arrangement comprises amplifier means for additionally amplifying a high-frequency range of the audio signal relative to a remaining range of the audio signal for, at most, a certain period of time when a value of the audio signal exceeds a limit value.

7. Method of influencing an audio signal, characterized in that said method comprises the steps:

receiving an audio signal having at least a high-frequency range; and additionally amplifying said high-frequency range of the audio signal relative to a remaining range of the audio signal for, at most, a certain period of time when a value of the audio signal exceeds a limit value.

* * * * *